US006459033B1

(12) United States Patent
Müller

(10) Patent No.: US 6,459,033 B1

(45) Date of Patent: Oct. 1, 2002

(54) REMOVABLY MOUNTABLE BLIND-TYPE CURTAIN

(76) Inventor: Hermann-Frank Müller, Lyngsbergstrasse 3a, D-53177, Bonn (Bad Godesberg) (DE)

( * ) Notice: Subject to any disclaimer, the term of this patent is extended or adjusted under 35 U.S.C. 154(b) by 0 days.

(21) Appl. No.: 09/678,944

(22) Filed: Oct. 3, 2000

(30) Foreign Application Priority Data

Oct. 3, 1999 (DE) ........................................ 199 47 640
Jan. 14, 2000 (DE) ........................................ 100 01 199

(51) Int. Cl.[7] ............................................ H01L 31/042

(52) U.S. Cl. ...................... 136/244; 136/245; 136/291; 126/600; 126/617; 126/624; 126/704; 160/129; 160/182

(58) Field of Search ................................ 136/244, 245, 136/291; 160/129, 182; 126/600, 617, 624, 704

(56) References Cited

U.S. PATENT DOCUMENTS 4,527,548 A * 7/1985 Gustafson .................. 126/607
5,076,634 A * 12/1991 Muller et al. .............. 296/97.5
5,221,363 A * 6/1993 Gillard ....................... 136/248
5,258,076 A * 11/1993 Wecker ...................... 136/245
5,433,259 A * 7/1995 Faludy ........................ 160/67

FOREIGN PATENT DOCUMENTS

DE 4003399 A1 * 8/1991
DE 19825017 C1 * 9/1999
WO WO-99/46473 A1 * 9/1999

* cited by examiner

*Primary Examiner*—Alan Diamond

(57) ABSTRACT

A removably mountable blind-type curtain is provided which includes a plurality of blinds removably securable to a curtain support. One or more of the blinds have a solar module secured thereto for converting solar energy to other energy. The blinds are connected to one another in a cable-free manner. An energy storage device is connected to the blinds for storing energy generated by the solar modules and an energy power take off device cooperates with an energy receiving device to effect the transfer of energy from the blind-type curtain to the energy receiving device. The energy storage device and the energy power take off device are mounted on the curtain support such that they are protected against external adverse environmental effects.

8 Claims, 1 Drawing Sheet

REMOVABLY MOUNTABLE BLIND-TYPE CURTAIN

BACKGROUND OF THE INVENTION

The present invention relates to a removably mountable blind-type curtain comprised, in particular, of flexible strips having solar modules on the top surface thereof for generating electricity and additionally comprising at least one energy storage device as well as an energy power take off device.

DE 40 03 399 C2 discloses a removably mountable solar curtain having flexible strips arranged in a curtain blind manner, the top surfaces of the flexible strips having solar modules mounted thereon. The sun curtain is coupled with an energy storage device as well as an energy power take off device. The solar curtain can be dismounted by itself as a discrete unit from a mounted disposition on a vehicle and then disposed at a selected location whereat the solar curtain can transfer out, on an as-needed basis, the acquired and subsequently stored energy as well as, in a suitable configuration thereof, transforming solar energy into additional energy.

A motorized vehicle solar curtain has a relatively small dimensional footprint whereby the solar energy has the capability to transform only a correspondingly modest amount of solar energy into other energy, even in a circumstance in which the entirety of the windows of the motorized vehicle are outfitted with such solar curtains.

The challenge is thus presented to provide an apparatus which, starting from the known configuration of a removably mountable solar curtain having flexible strips with solar modules mounted on the top surfaces thereof and at least an energy storage device and an energy power take off device, is configured such that an acceptable amount of energy can be produced.

SUMMARY OF THE INVENTION

The challenge can be met by providing a removably mountable blind-type curtain which is suitable for installation in a residence on, for example, a window thereof, and can be handily carried on or in a vehicle with the individual blinds of the blind-type curtain being removable and connected to one another in a cable-free manner and the blind-type curtain being further comprised of at least one energy storage device and an energy power take off device which are mounted on the curtain retaining frame in a manner to protect them from adverse external environmental effects.

DE 198 10 436 A1 discloses blind-type curtain apparatus which provide photovoltaic energy conversion capabilities such as, for example, apparatus of this type mounted as building facades or general area lighting of buildings; however, these apparatus are not configured for self contained removal nor are they transport-ready, especially for short term use on selected other locations.

Blind-type curtains for window openings typically comprise horizontally oriented blinds. However, as disclosed in DE 29 29 323 A1 and DE 29 40 840 A1, curtains with vertically oriented blinds are also part of the conventional technical art. Such vertically oriented blinds are to be preferred, from the perspective of the transport of such curtains, mainly because such blinds can be inserted, at the selected curtain mounting location and orientation, in a desired serial arrangement into the curtain support. However, this known jalousie arrangement cannot be seen to suggest either the transport or the provision of solar modules in accordance with the present invention.

Each blind of the apparatus of the present invention acts as a self contained solar energy transformation unit if the solar modules of the solar cell strips are, in particular, electrically connected with one another via a pressed switch. However, it is to be understood that other switch or actuation configurations are possible.

In order to avoid having to provide each blind with its own energy storage device, which devices would, in turn, be coupled with the total system energy storage device on the curtain support, each individual blind is connected via an electrically conductive push button system, in a manner protecting against exterior influences (moisture, dirt, and the like), with at least one neighboring blind to which the respective conductor for the switch extends. Such push button systems are known, for example, for use with bicycle lights.

It is advantageous, for stability reasons, if each individual blind is removably couplable along its lengthwise extent with at least one neighboring blind, such as, for example, via a separable zipper, whereby it can be beneficial to provide such a zipper and, additionally, the entire blind, with a moisture-, water-, and dirt-shedding coating in accordance with the Lotus effect. As needed—such as, for example, in connection with the replacement of damaged blinds—one or several blinds not having a solar module can be removably disposed between other blinds, whereby care must nonetheless be taken, by configuring a corresponding electrical connection and push button system, to ensure that there are no interruptions in the conducting of energy to the energy storage device.

To effect, as necessary, a pulling apart and moving together of the blind-type curtain, an actuation device is provided, whereby a particular configuration thereof is left to the wishes of the fabricator to the extent that the fabricator desires, in accordance with design requirements or customer wishes, to include a motor driven actuation such as, for example, a switch linkage as disclosed in DE 31 26 038 A1 or, for example, a hydraulic drive unit as disclosed in DE 198 10 436 A1, whereby an automatic actuation capability triggered by sensors (DE 196 02 180 A1), lighting capability (DE 28 09 436), or the like can play a role in the configuration.

BRIEF DESCRIPTION OF THE DRAWING

The blind-type curtain of the present invention is hereinafter described with reference to an exemplary embodiment thereof which is shown in the sole FIGURE of the drawings.

DETAILED DESCRIPTION OF THE PREFERRED EMBODIMENT

Figure 1:
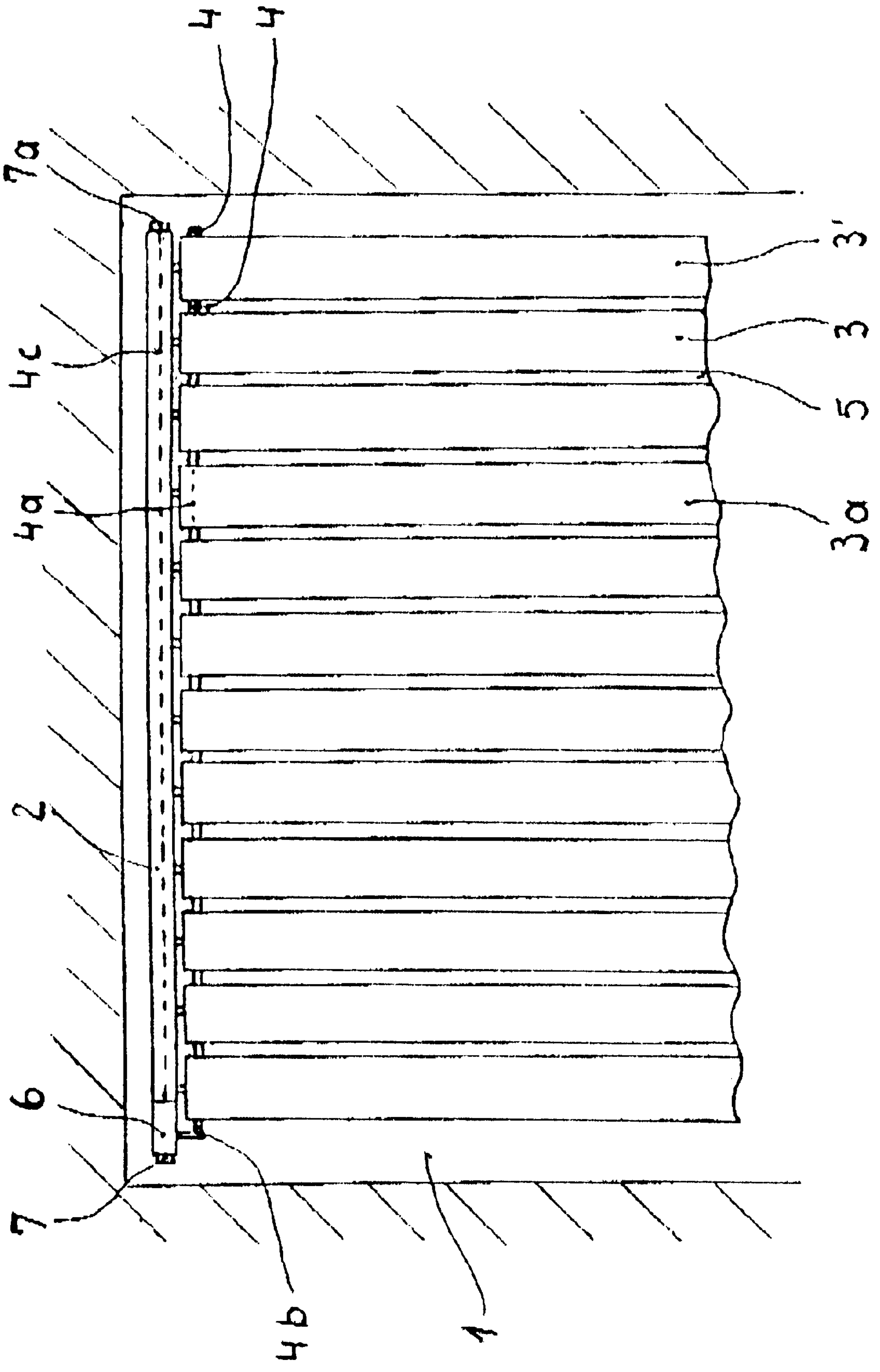

A plurality of blinds 3 are shown in hanging disposition from a curtain support 2 in a manner of which there are multiple examples in the curtain art, the blinds 3 being insertably mountable onto the curtain support 2 which itself is mounted at a window opening 1 of a wall. The curtain support 2 is in any event removably mounted, either by virtue of its mounting disposition in eyes which are fixedly located in a wall or in the opening framing, via the assistance, for example, of closeable pegs of the type described in DE 40 03 399 C2 in connection with a solar blind, or via another mounting configuration.

Solar modules in the form of solar cell strips are disposed on the blinds 3, whereby the solar modules, which may be, for example, thin coat solar cells of monocrystal, polycrystal, or amorphous silicon, are electrically connected with one another via, in particular, a pressed switch. The individual blinds 3 are each connected, with at least one neighboring blind 3, in a manner known in connection with bicycle lighting, by, for example, an electrically conductive push button system which is protected against adverse external environmental influences. If the blind-type curtain is mounted outside of the window, it is advisable in this circumstance to ensure that the solar cell strips are provided with a protective coating which is operable to shed moisture and which does not promote the accumulation thereon of dirt, in accordance with the Lotus effect and which, moreover, does not degrade the transmission of light therethrough to the solar cells. The desirability of such a protective coating for a deployment of the thus described blind-type curtain on the outside of a building is self-evident.

In order to cover the intermediate space between individual blinds 3, each neighboring pair of individual blinds 3 are connected to one another by means, for example, of a separable zipper 5 which preferably has an extent sufficient to extend along the entire extent of the blinds and which can, in any event, be provided with a protective coating by the "Lotus effect". The blind-type curtain is configured as a stable unit by virtue of the zipper 5 or another structure operable to interconnect the blinds 3 to one another. As required, one or more blinds 3*a* not having solar cell strips can be individually or groupwise assembled into the blind-type curtain in order, for example, to enlarge the curtain span or to permit replacement of damaged blinds 3 which require repair. Those blinds 3*a* not having solar cell strips must be provided with the capability of the push button system 4 for connection with the neighboring blinds 3 as well as bridging electrical connections 4*a*, in order to ensure that the path of energy transmission from the individual solar cell strips to the energy storage device 6 is not interrupted.

The energy storage device 6 can be configured, for example, as an accumulator, a high performance capacitor, a flexible energy storage device (for example, "Goldstar condensers") or the like. The arrangement of the energy storage device 6 can—as illustrated—be provided on the curtain support 2 as required but also additionally on the individual blinds 3 or on other selected locations. Thus, for example, in the use of several blind-type curtains for a common configuration without the removal from the building, a main energy storage device may be required which is centrally located and is connected to the individual energy storage devices 6 for receiving energy therefrom. The energy storage devices 6 should preferably include a connector 4*b* for corresponding connection with the push button system 4 of the individual blinds and, as desired, a device 7 for energy power take off for use by an energy consumer. As seen in the sole figure of the drawings, an assembly component 7*a* is disposed on the end of the curtain support 2 which is opposite to the end thereof on which the energy storage device 6 is disposed, and the assembly component 7*a* is electrically connected with the energy storage device 6 by an electrical connection 4*c* and can, as required, be a part of a push button system for an electrically couplable additional curtain support, a device for energy power take off, or a closeable protective cap. If additional energy storage devices 6 are to be provided on the individual blinds 3, it can be advisable to provide a special connection (not shown) over the push button system 4 to the electrical connector 4*c*. It is to be understood that other connection configurations such as, for example, socket connections, can be provided instead of the push button system. In this connection, the "free" push button piece 4' of the "end blind" 3' is available.

Suitable conventional devices are provided to effectuate the pulling apart (opening) and moving together (closing) of the blind-type curtain. In connection with such moving together operations, it is necessary to separate the zipped zippers 5 before the operation, if such zippers are not sufficiently wide enough and/or elastic enough for the folding process which the curtain undergoes during the operation.

The deployment of the blind-type curtain can be performed manually, by motor drive, hydraulically, pneumatically, or in like manner. In connection with an automatic deployment, in addition, for example, to a timing device for deployment at predetermined times, a sensor can be used to effectuate deployment in response to sensed movement, minimum particular temperature changes, or the like. Additional possibilities are available such as, for example, deployment via radio control. All of the components required for effecting deployment of the blind-type curtain can, to the extent they are subjected to adverse environmental conditions, be protected thereagainst by components (not shown) on the blind-type curtain.

In the arrangement of the blind-type curtain of the present invention, inquiry should be made as to whether, for example, tinted plates at the window degrade the receipt of light on the solar modules. The use of transparent solar modules effect, on the one hand, the light relationship into the space by virtue of a reduction of the darkening effects of the curtain while, on the other hand, the solar modules disposed on the backside of the blind receive light for the conversion of energy therefrom. The distribution of light into the space can be improved by disposing light transferring and/or reflective thin coatings on those sides of the individual blinds which face toward the building interior.

The blind-type curtain of the present invention can be deployed not only in buildings but also in vehicles such as, for example, recreational vehicles, on ships, in rail cars, and the like for enhanced energy supply to, for example, a ventilator, an air conditioner, a light, an alarm unit, a combustion cell, and so forth.

The specification incorporates by reference the disclosure of German priority documents 199 47 640.3 of Oct. 3, 1999 and 100 01 199.3 of Jan. 14, 2000.

The present invention is, of course, in no way restricted to the specific disclosure of the specification and drawings, but also encompasses any modifications within the scope of the appended claims.

What I claim is:

1. A removably mountable blind curtain, comprising:

a plurality of blinds, the blinds being separately and removably securable to a curtain support, at least one of the blinds having a solar module secured thereto for converting solar energy to other energy;

means for connecting the blinds to one another in a cable-free manner;

an energy storage device connected to the at least one blind for storing said other energy generated by the solar module; and an energy power take off device for cooperating with an energy receiving device to effect the transfer of energy from the blind curtain to the energy receiving device, the energy storage device and the energy power take off device being mounted on the curtain support such that they are protected against adverse external environmental effects.

2. A removably mountable blind curtain according to claim 1, wherein each blind is removably securable to the curtain support in a manner in which the blind is in a suspended disposition.

3. A removably mountable blind curtain according to claim 1, wherein a second blind has a solar module secured thereto and the solar modules of the at least One blind and the second blind are electrically connected to one another.

4. A removably mountable blind curtain according to claim 1, wherein the means for connecting the blinds to one another is operable to electrically interconnect. the blinds in a manner which discourages the penetration of adverse external environmental effects into the blind curtain.

5. A removably mountable blind curtain according to claim 1, wherein each blind includes a protective coating which discourages the penetration therethrough of moisture and dirt.

6. A removably mountable blind curtain according to claim 1, wherein the means for connecting the blinds to one another includes means associated with each blind for removably connecting the blind along its lengthwise extent with a neighboring blind.

7. A removably mountable blaind curtain according to claim 1, wherein a group of the blinds each have solar modules mounted thereon and a blind without a solar module is interposed between each adjacent pair of blinds having solar modules.

8. A removably mountable blind curtain according to claim 1, and further comprising a device for selectively pulling apart the blinds into a pulled apart disposition and moving the blinds together from a pulled apart disposition.

* * * * *